United States Patent
Omi et al.

(10) Patent No.: US 8,912,513 B2
(45) Date of Patent: Dec. 16, 2014

(54) CHARGED PARTICLE BEAM WRITING APPARATUS AND CHARGED PARTICLE BEAM WRITING METHOD

(71) Applicant: NuFlare Technology, Inc., Shizuoka (JP)

(72) Inventors: Kentaro Omi, Shizuoka (JP); Michihiro Kawaguchi, Shizuoka (JP); Keisuke Yamaguchi, Shizuoka (JP)

(73) Assignee: NuFlare Technology, Inc., Yokohama (JP)

( * ) Notice: Subject to any disclaimer, the term of this patent is extended or adjusted under 35 U.S.C. 154(b) by 0 days.

(21) Appl. No.: 13/799,035

(22) Filed: Mar. 13, 2013

(65) Prior Publication Data

US 2013/0250282 A1    Sep. 26, 2013

(30) Foreign Application Priority Data

Mar. 22, 2012 (JP) ................. 2012-065385

(51) Int. Cl.
```
G21K 5/04      (2006.01)
H01J 37/22     (2006.01)
H01J 37/317    (2006.01)
H01J 37/304    (2006.01)
```

(52) U.S. Cl.
CPC ....... *H01J 37/22* (2013.01); *H01J 2237/31776* (2013.01); *H01J 2237/2482* (2013.01); *H01J 37/3174* (2013.01); *H01J 37/3045* (2013.01)
USPC .............. 250/492.3; 250/396 R; 250/397; 250/492.1; 250/492.2

(58) Field of Classification Search
USPC ........... 250/306, 307, 492.1, 492.2, 492.21, 250/492.22, 492.3, 396 R, 397; 850/5, 6, 7
See application file for complete search history.

(56) References Cited

U.S. PATENT DOCUMENTS

| | | | |
|---|---|---|---|
| 5,781,607 A | 7/1998 | Acosta et al. | |
| 7,640,142 B2 * | 12/2009 | Tachikawa et al. | 702/197 |
| 8,080,809 B2 * | 12/2011 | Abe | 250/396 R |
| 8,277,603 B2 * | 10/2012 | Tamamushi et al. | 156/345.4 |
| 2003/0116721 A1 | 6/2003 | Ito | |
| 2009/0173612 A1 | 7/2009 | Crutcher | |
| 2011/0155930 A1 * | 6/2011 | Kawaguchi et al. | 250/492.22 |

FOREIGN PATENT DOCUMENTS

| | | |
|---|---|---|
| JP | 2007258659 A | 10/2007 |
| JP | 2011-014630 | 1/2011 |
| JP | 2011014630 A | 1/2011 |
| JP | 2011134974 A | 7/2011 |
| TW | 571346 B | 1/2004 |
| TW | 201109837 A | 3/2011 |

OTHER PUBLICATIONS

Japanese Office Action with Translation dated Dec. 5, 2013.
Korean Office Action with Translation dated Jan. 14, 2014.
Taiwan Search Report for Application No. 102109500, dated Jul. 11, 2014.

* cited by examiner

*Primary Examiner* — Nicole Ippolito
(74) *Attorney, Agent, or Firm* — Patterson & Sheridan, LLP

(57) ABSTRACT

A charged particle beam writing apparatus according to an embodiment, includes a laser displacement meter configured to measure a position of a substrate to be written; a correction unit configured to correct a misregistration amount of the position of the substrate measured by the laser displacement meter from a reference position of the substrate; and a writing unit configured to write a pattern onto the substrate corrected for the misregistration amount by using a charged particle beam.

8 Claims, 15 Drawing Sheets

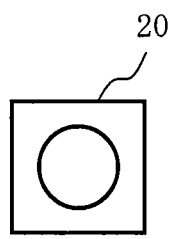
FIG. 15A
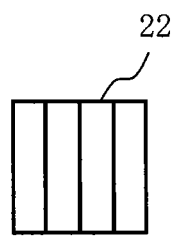
FIG. 15C
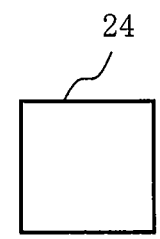
FIG. 15E
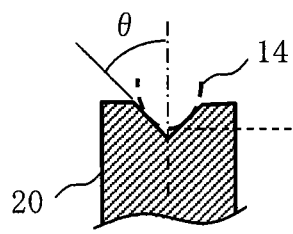
FIG. 15B
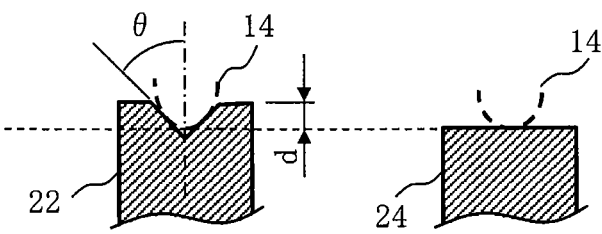
FIG. 15D
FIG. 15F

CHARGED PARTICLE BEAM WRITING APPARATUS AND CHARGED PARTICLE BEAM WRITING METHOD

CROSS-REFERENCE TO RELATED APPLICATION

This application is based upon and claims the benefit of priority from prior Japanese Patent Application No. 2012-065385 filed on Mar. 22, 2012 in Japan, the entire contents of which are incorporated herein by reference.

BACKGROUND OF THE INVENTION

1. Field of the Invention

Embodiments described herein relate generally to a charged particle beam writing apparatus and a charged particle beam writing method and, for example, to a writing apparatus that writes a pattern on a substrate on which a substrate cover is mounted by using an electronic beam and a method therefor.

2. Related Art

Lithography technology taking charge of development of increasingly finer semiconductor devices is an extremely important process that, among semiconductor fabrication processes, solely generates a pattern. In recent years, with increasing integration of LSI, the circuit linewidth required for semiconductor devices becomes ever finer year after year. To form a desired circuit pattern for such semiconductor devices, a high-accuracy original picture pattern (also called a reticle or mask) is needed. Electron beam (EB) writing technology has intrinsically excellent resolving power and is used for production of a high-accuracy original picture pattern.

FIG. 16 is a conceptual diagram illustrating the operation of a variable-shaped electron beam writing apparatus. The variable-shaped electron beam writing apparatus operates as described below. A first aperture plate 410 has a rectangular opening 411 formed to shape an electron beam 330. A second aperture plate 420 has a variable-shaped opening 421 formed to shape the electron beam. 330 having passed through the opening 411 of the first aperture plate 410 to a desired rectangular shape. The electron beam 330 having been irradiated from a charged particle source 430 and passed through the opening 411 of the first aperture plate 410 is deflected by a deflector and passes through a portion of the variable-shaped opening 421 of the second aperture plate 420 before being shone on a target object 340 mounted on a stage continuously moving in a predetermined direction (for example, the X direction). That is, a rectangular shape capable of passing through the opening 411 of the first aperture plate 410 and the variable-shaped opening 421 of the second aperture plate 420 is written in a writing region of the target object 340 mounted on the stage continuously moving in the X direction. The method of creating any shape by allowing an electron beam to pass through both the opening 411 of the first aperture plate 410 and the variable-shaped opening 421 of the second aperture plate 420 is called a variable shaping method.

When a pattern is written by a writing apparatus, an outer circumferential portion of a target object may be covered with a frame-shaped mask cover so that an insulated portion on the end face of a mask (substrate) to be the target object is not charged with reflected electrons of an irradiated electron beam. In such a case, the mask cover is stored on a transport path in a vacuum inside the writing apparatus to be mounted on a mask when a pattern is written. Misregistration (error) may arise between the mask and mask cover. If the mask cover is used for writing a pattern a plurality of times without performing alignment, errors are accumulated and misregistration that cannot be tolerated may arise. Thus, to prevent such errors from being accumulated, it is desirable to mount the cover in an accurate position with respect to the mask by performing alignment each time before the cover is mounted on the mask. Thus, performing alignment of the mask cover after the mask cover being removed from the mask by separately providing a fulcrum for supporting the mask cover and a fulcrum for alignment of the mask cover is proposed (see Published Unexamined Japanese Patent Application No. 2011-14630, for example).

In addition to misregistration between the mask and mask cover, misregistration from the ideal position of the mask during transport is assumed. To address such a problem, alignment of the mask has been performed on the transport path. To find the position of the mask, an image of a region containing corners of the mask captured by a CCD camera or the like from above or below has been used. However, illumination toward the camera across the mask is needed to capture an image by the camera and diffraction conditions of illumination change from mask to mask to be measured due to the end face shape of the mask substrate, the C surface shape of mask corners, and variations of transmittance. Thus, measured results vary. Further, the measuring time is long due to operations to turn on and turn off a lighting system.

As described above, it is desirable to suppress misregistration between a mask substrate and a mask substrate cover. It is also necessary to measure the position with high accuracy to find the amount of misregistration. However, the method for solving these problems adequately has not been established.

BRIEF SUMMARY OF THE INVENTION

In accordance with one aspect of the present invention, a charged particle beam writing apparatus includes a laser displacement meter configured to measure a position of a substrate to be written; a correction unit configured to correct a misregistration amount of the position of the substrate measured by the laser displacement meter from a reference position of the substrate; and a writing unit configured to write a pattern onto the substrate corrected for the misregistration amount by using a charged particle beam.

In accordance with another aspect of this invention, a charged particle beam writing apparatus includes a laser displacement meter configured to measure a position of a substrate cover while the substrate cover that covers an entire outer circumferential portion of a substrate to be written from above is not mounted on the substrate; a writing unit configured to write a pattern onto the substrate by using a charged particle beam while the substrate cover is mounted on the substrate; a correction unit configured to correct a relative position between the substrate and the substrate cover by shifting a position of the substrate for a misregistration amount of the substrate cover between a relative reference position of the substrate cover relative to a reference position of the substrate and a position of the substrate cover measured by the laser displacement meter while the substrate cover is not mounted on the substrate; and a substrate cover mounting/removal mechanism unit configured to mount the substrate cover on the substrate for which the relative position between the substrate and the substrate cover is corrected by shifting the position of the substrate and also to remove the substrate cover from the substrate.

In accordance with a further aspect of the invention, a charged particle beam writing method includes measuring a position of a substrate cover while the substrate cover that covers an entire outer circumferential portion of a substrate to be written from above is not mounted on the substrate; correcting a relative position between the substrate and the substrate cover by shifting a position of the substrate for a misregistration amount of the substrate cover between a relative reference position of the substrate cover relative to a reference position of the substrate and the position of the substrate cover measured while the substrate cover is not mounted on the substrate; mounting the substrate cover on the substrate for which the relative position between the substrate and the substrate cover is corrected by shifting the position of the substrate; and writing a pattern onto the substrate by using a charged particle beam while the substrate cover is mounted on the substrate.

BRIEF DESCRIPTION OF THE DRAWINGS

FIGS. 15A to 15F are conceptual diagrams showing top surface shapes of three alignment support members according to Embodiment 1.

DETAILED DESCRIPTION OF THE INVENTION

Embodiment 1

In the embodiment below, the configuration using an electron beam as an example of a charged particle beam will be described. However, the charged particle beam is not limited to the electron beam and a beam using a charged particle like an ion beam may also be used.

In the embodiment below, a writing apparatus capable of measuring the position with high accuracy to eliminate misregistration and a method therefor will be described. Also, an apparatus for suppressing misregistration between a substrate and a substrate cover with high accuracy and a method therefor will be described.

Figure 1:
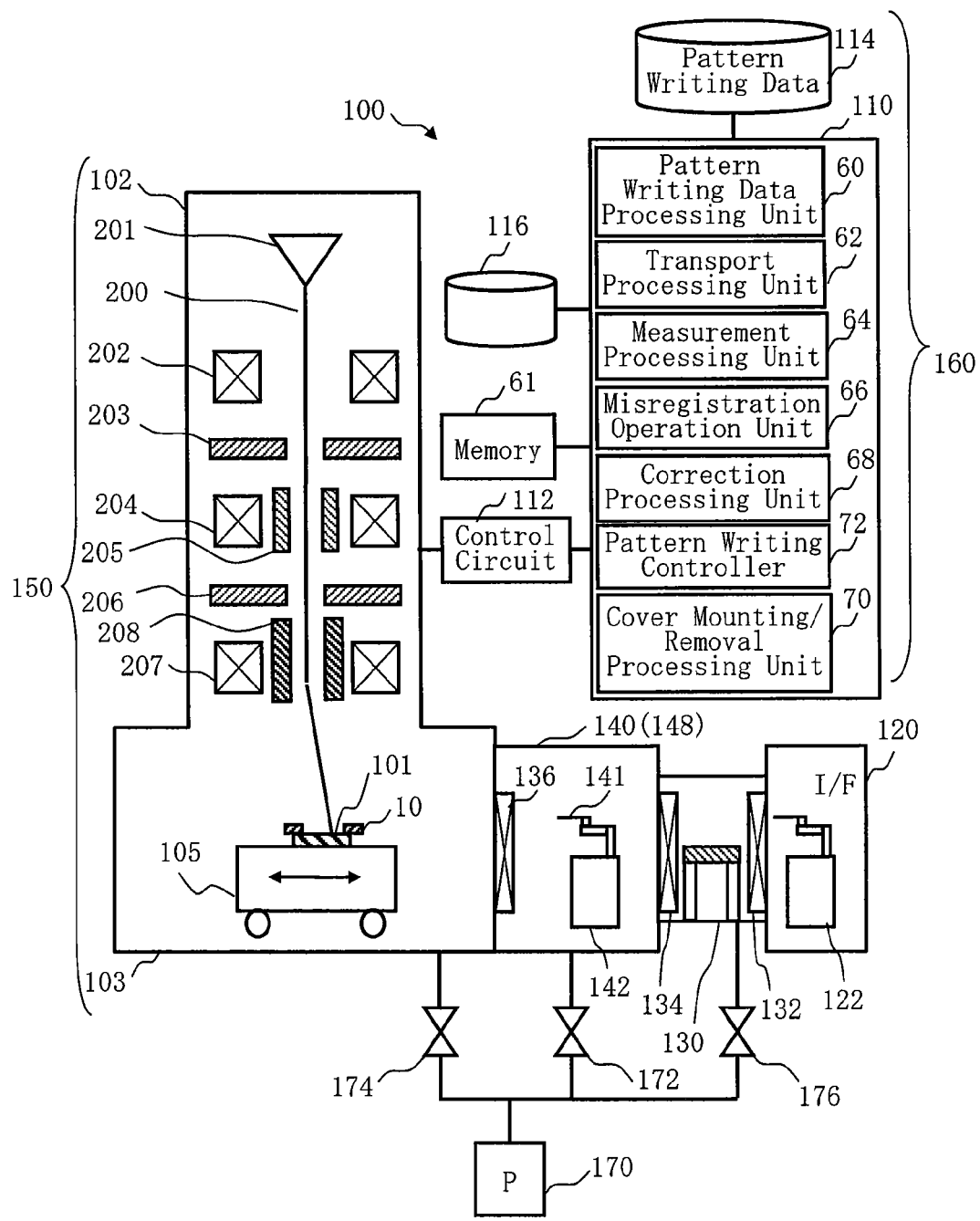
FIG. 1 is a conceptual diagram showing the configuration of a writing apparatus according to Embodiment 1.

FIG. 1 is a conceptual diagram showing the configuration of a writing apparatus according to Embodiment 1. In FIG. 1, a writing apparatus 100 includes a writing unit 150, a controller 160, a carrying-in/out port (I/F) 120, a load lock (L/L) chamber 130, a robot chamber 140, a substrate cover mounting/removal chamber 148, and a vacuum pump 170. The writing apparatus 100 (drawing apparatus) is an example of the charged particle beam writing apparatus. The writing apparatus 100 writes (or "draws") a desired pattern on a substrate 101.

The writing unit 150 includes an electron lens barrel 102 and a pattern writing chamber 103. In the electron lens barrel 102, an electron gun assembly 201, an illumination lens 202, a first aperture plate 203, a projection lens 204, a deflector 205, a second aperture plate 206, an objective lens 207, and a deflector 208 are arranged. In the pattern writing chamber 103, an XY stage 105 arranged movably is arranged. The substrate 101 on which a substrate cover 10 is mounted is arranged on the XY stage 105. Though not illustrated, the substrate 101 is ground-connected (grounded) to the writing apparatus 100 via the substrate cover 10. A transport robot 122 that transports the substrate 101 is arranged inside the carrying-in/out port 120. A transport robot 142 that transports the substrate 101 is arranged inside the robot chamber 140.

The vacuum pump 170 exhausts gases inside the robot chamber 140, an alignment chamber 146, and the substrate cover mounting/removal chamber 148 (or "substrate cover attaching/removal chamber") via a valve 172. A vacuum atmosphere is thereby maintained inside the robot chamber 140 and the substrate cover mounting/removal chamber 148. The vacuum pump 170 also exhausts gases inside the electron lens barrel 102 and the pattern writing chamber 103 via a valve 174. A vacuum atmosphere is thereby maintained inside the electron lens barrel 102 and the pattern writing chamber 103. The vacuum pump 170 also exhausts a gas inside the load lock chamber 130 via a valve 176. A vacuum atmosphere is thereby controlled inside the load lock chamber 130 when necessary. Gate valves 132, 134, 136 are arranged in respective boundaries of the carrying-in/out port 120, the load lock chamber 130, the robot chamber 140, and the pattern writing chamber 103. For example, the substrate 101 includes a mask substrate for exposure that transfers a pattern to a wafer. The mask substrate includes, for example, mask blanks on which no pattern is formed.

The controller 160 includes a control computer 110, a control circuit 112, a memory 61, and storage devices 114, 116 such as magnetic disk drives. The control computer 110, the control circuit 112, the memory 61, and the storage devices 114, 116 such as magnetic disk drives are mutually connected via a bus (not shown). The writing apparatus 100 is controlled by the control circuit 112 controlled by a signal from the control computer 110 and each device in the writing unit 150, the carrying-in/out port 120, the load lock chamber 130, and the substrate cover mounting/removal chamber 148 is driven according to content of the control.

A pattern writing data processing unit 60, a transport processing unit 62, a measurement processing unit 64, a misregistration operation unit 66, a correction processing unit 68, a cover mounting/removal processing unit 70, and a pattern writing controller 72 are arranged in the control computer 110. Each function of the pattern writing data processing unit

60, the transport processing unit 62, the measurement processing unit 64, the misregistration operation unit 66, the correction processing unit 68, the cover mounting/removal processing unit 70, and the pattern writing controller 72 may be configured by hardware such as electric circuits or software such as programs executing these functions. Alternatively, each function may be configured by a combination of hardware and software. Information input into or output from the pattern writing data processing unit 60, the transport processing unit 62, the measurement processing unit 64, the misregistration operation unit 66, the correction processing unit 68, the cover mounting/removal processing unit 70, and the pattern writing controller 72 and information during operation are each time stored in the memory 61.

FIG. 1 shows only structural elements necessary for describing Embodiment 1. It is needless to say that the writing apparatus 100 may contain other normally needed structural elements.

Figure 2:
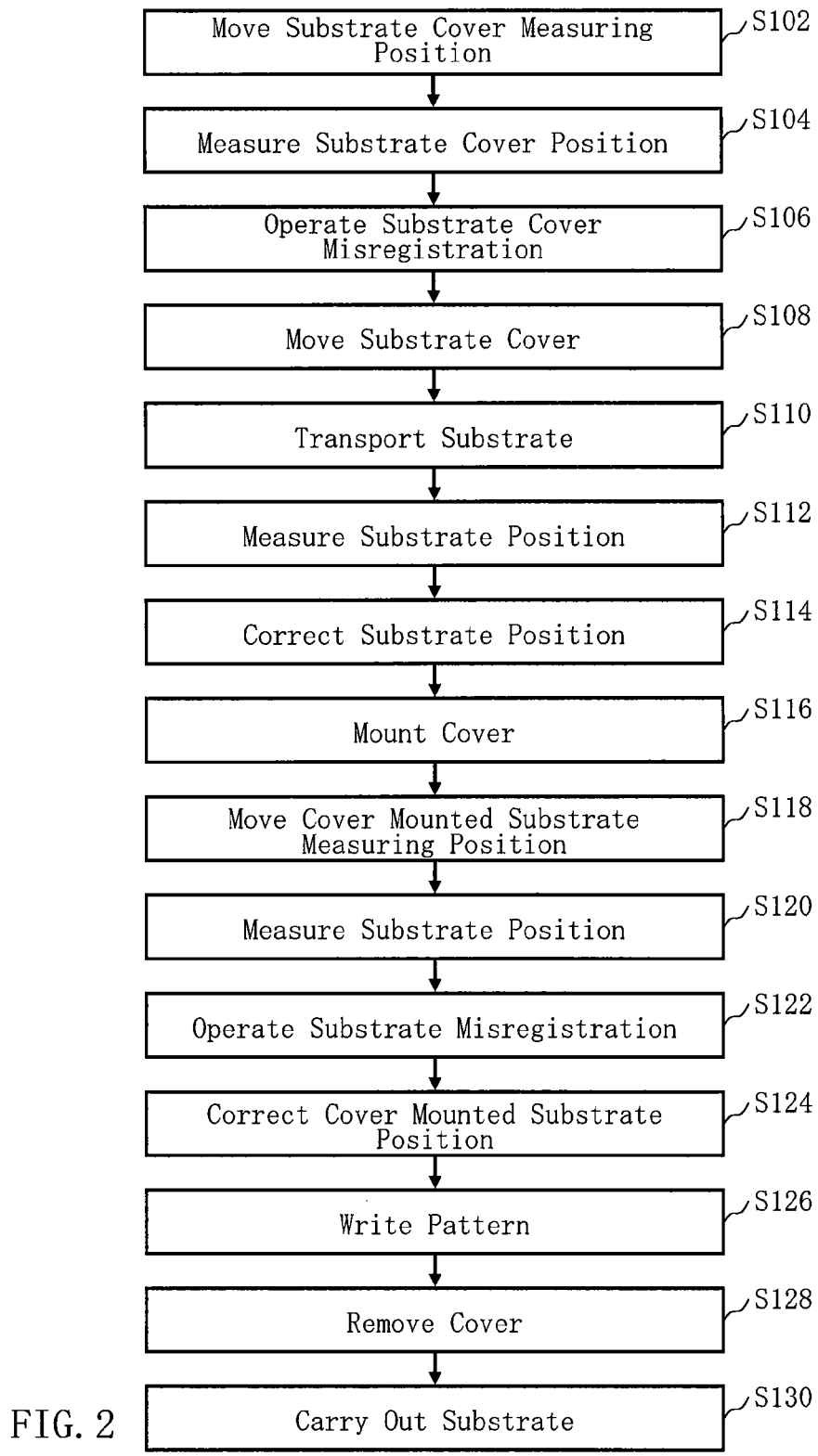
FIG. 2 is a flow chart showing principal processes of a pattern writing method according to Embodiment 1.

FIG. 2 is a flow chart showing principal processes of a pattern writing method according to Embodiment 1. In FIG. 2, the pattern writing method according to Embodiment 1 performs a series of processes including a substrate cover measuring position movement process (S102), a substrate cover position measurement process (S104), a substrate cover misregistration operation process (S106), a substrate cover movement process (S108), a substrate transport process (S110), a substrate position measurement process (S112), a substrate position correction process (S114), a cover mounting process (S116), a cover mounted substrate measuring position movement process (S118), a substrate position measurement process (S120), a substrate misregistration operation process (S122), a cover mounted substrate position correction process (S124), a pattern writing process (S126), a cover removal process (S128), and a carrying-out process (S130).

Figure 3:
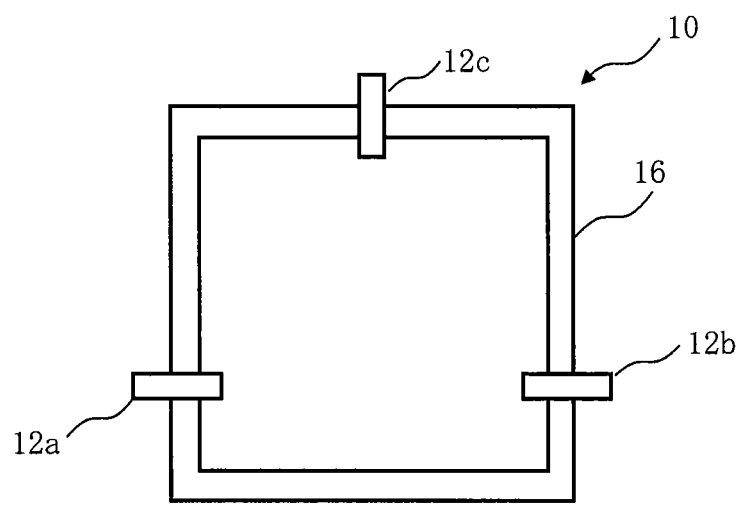
FIG. 3 is a top view showing a substrate cover according to Embodiment 1.
Figure 4:
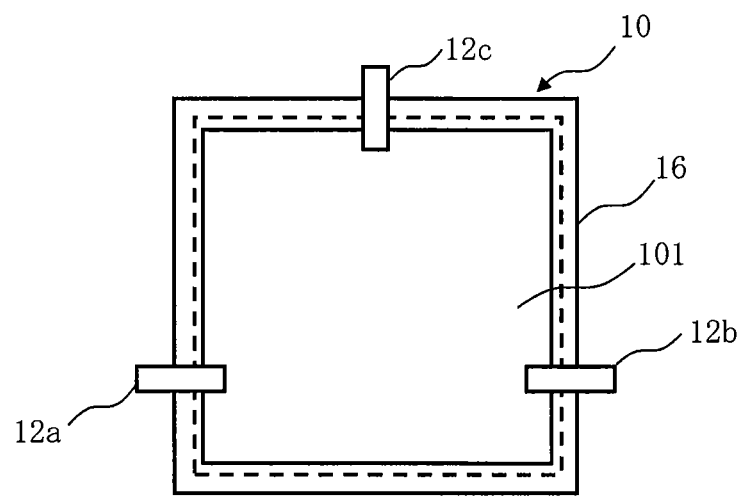
FIG. 4 is a top view showing a state in which the substrate cover in FIG. 3 is mounted on a substrate.
Figure 5:
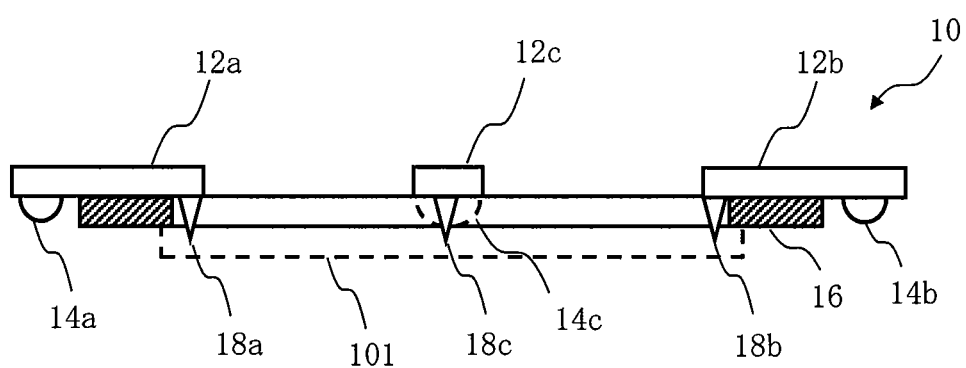
FIG. 5 is a sectional view of the substrate cover in FIG. 3.

FIG. 3 is a top view showing a substrate cover according to Embodiment 1. FIG. 4 is a top view showing a state in which the substrate cover in FIG. 3 is mounted on a substrate. FIG. 5 is a sectional view of the substrate cover in FIG. 3. The substrate cover 10 includes three contact support members 12 and a frame 16 (an example of the frame-shaped member). The contact support members 12 are mounted from the top surface side of the frame 16 in positions to support the substrate cover 10 in the three-point support. The contact support members 12 are mounted so as to project to the inner side from the inner circumferential edge of the frame 16 and to the outer side from the outer circumferential edge thereof. The contact support members 12 are fixed to the frame 16 by, for example, screwing or welding. A pin 18 as a contact portion is arranged on the back side of each of the contact support members 12 in a position on the inner side from the inner circumferential edge of the frame 16 with the tip thereof directed toward the back side. Also, a hemispheric height 14 is arranged on the back side of each of the contact support members 12 in a position on the outer side from the outer circumferential edge of the frame 16 in such a way that the spherical surface of the height 14 is directed toward the outside.

The frame 16 is made of a plate material and formed in such away that the outer circumferential dimension thereof is larger than the outer circumferential edge of the substrate 101 and the dimension of an opening formed in the center on the inner side is smaller than the outer circumferential edge of the substrate 101. That is, the frame 16 is formed so that when, as shown in FIG. 4, the substrate cover 10 is placed on top of the substrate 101, the entire perimeter of the outer circumferential portion of the substrate 101 indicated by a dotted line is laid on the frame 16. Thus, the substrate cover 10 covers the entire outer circumferential portion of the substrate 101 from above. When the substrate cover 10 is mounted (or "attached" or "placed") on the substrate 101, the three pins 18 dig into a film formed on the substrate 101 and are electrically connected to a conductive film similarly formed on the substrate 101.

The substrate cover 10 is suitably formed of a conductive material wholly or formed of an insulating material wholly and the surface thereof is coated with a conductive material. The conductive material is suitably a metallic material, for example, copper (Cu), titanium (Ti), or an alloy thereof and the insulating material is suitably a ceramic material, for example, alumina.

Figure 6A:
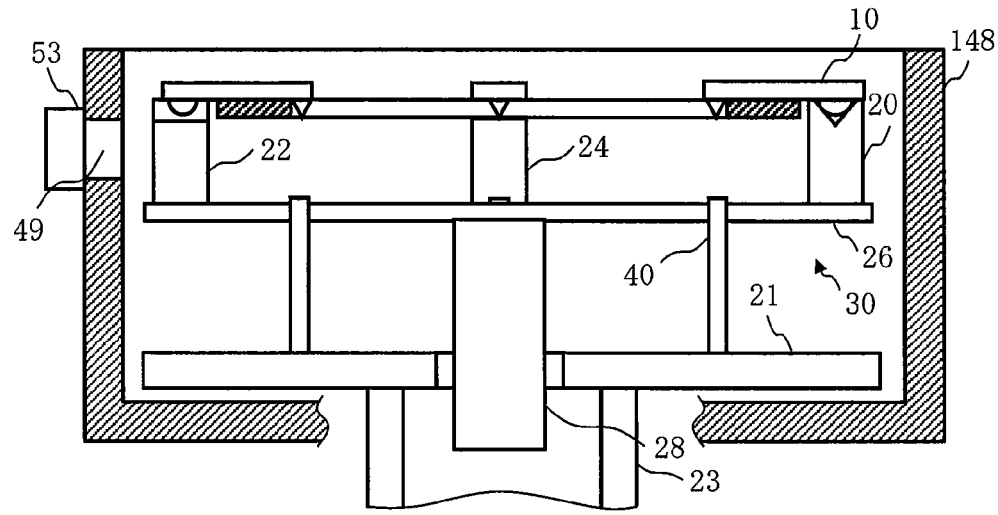
FIGS. 6A and 6B are conceptual diagrams showing the configuration and operation of a substrate cover mounting/removal mechanism according to Embodiment 1.
Figure 6B:
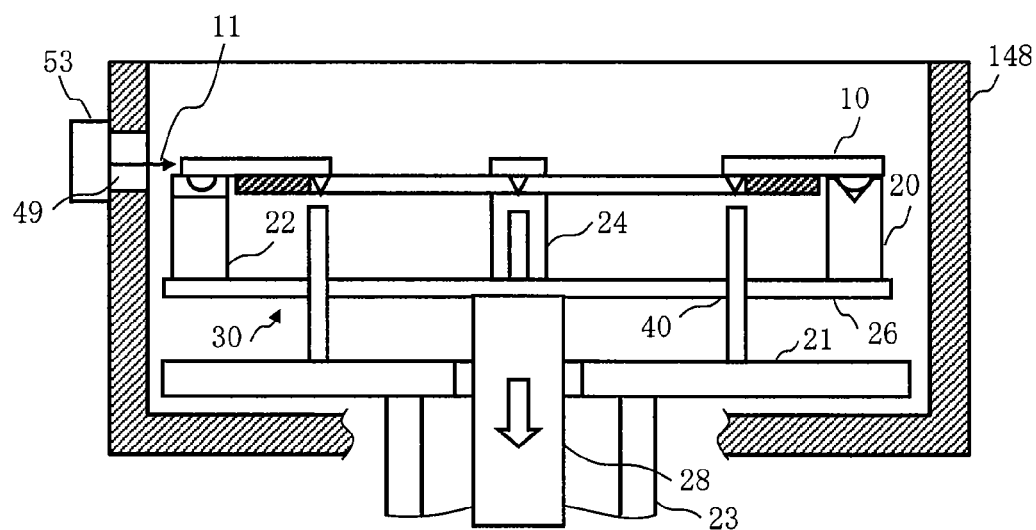

FIGS. 6A and 6B are conceptual diagrams showing the configuration and operation of a substrate cover mounting/removal mechanism according to Embodiment 1. FIGS. 6A and 6B show the operation of the substrate cover measuring position movement process (S102) and the substrate cover position measurement process (S104).

In FIG. 6A, a substrate cover mounting/removal mechanism 30 (substrate cover mounting/removal unit) (or "substrate cover attaching/removal unit") is arranged in the substrate cover mounting/removal chamber 148. In a stage before mounting on the substrate 101, the substrate cover 10 is mounted (or "attached" or "placed") on the substrate cover mounting/removal mechanism 30. The substrate cover mounting/removal mechanism 30 includes three rod-like alignment support members 20, 22, 24, a platform table 26, a rise and fall shaft 28, a rotation axis 23, a rotation base plate 21, and three rod-like substrate support pins 40. The substrate cover mounting/removal mechanism 30 mounts/demounts the substrate cover 10 to cover the entire outer circumferential portion of the substrate to be written from above on/from the substrate 101. The three rod-like alignment support members 20, 22, 24 are fixed onto the platform table 26. The platform table 26 is supported on the back side by the rise and fall shaft 28. The rise and fall shaft 28 is vertically movably arranged and the alignment support members 20, 22, 24 move vertically accompanying the movement of the rise and fall shaft 28. The three substrate support pins 40 are fixed onto the rotation base plate 21. The rotation base plate 21 is arranged on the rotation axis 23 and rotated by a rotating mechanism (not shown) arranged outside the substrate cover mounting/removal chamber 148 within a predetermined rotation angle range. An opening is formed in the platform table 26 so that, even if the rotation base plate 21 rotates within the predetermined rotation angle range, the rotation base plate 21 should not come into contact with the three substrate support pins 40. The three alignment support members 20, 22, 24 are each arranged in positions where the three heights 14 of the substrate cover 10 can be mounted. The three substrate support pins 40 are arranged in positions where the back side of the substrate 101 is three-point supported. The rotation axis 23 rotates around the center of the surface of the substrate 101. Thus, the rotation base plate 21 and the three substrate support pins 40 arranged thereon rotate around the center of the surface of the substrate 101.

A glass window 49 is arranged in a predetermined height position on the wall surface of the substrate cover mounting/removal chamber 148 and a laser displacement meter 53 is arranged on the outer side of the glass window 49. Thus, the laser displacement meter 53 is arranged on the outer side of the substrate cover mounting/removal chamber 148. Accordingly, heat from the laser displacement meter 53 can be inhibited from being transmitted into the substrate cover mounting/removal chamber 148. The laser displacement meter 53 irradiates a measurement object inside the substrate cover mounting/removal chamber 148 with laser light 11 through the glass window 49 and receives reflected light thereof through the glass window 49. The set height position of the laser displacement meter 53 may be arranged as a height position that can be moved to when the substrate cover 10 rises or falls and also as a height position that does not interfere with the three substrate support pins 40.

As the substrate cover measuring position movement process (S102), the cover mounting/removal processing unit 70 moves the substrate cover 10 to the measuring position. By, for example, lowering the rise and fall shaft 28 from the position shown in FIG. 6A, as shown in FIG. 6B, the substrate cover 10 is moved to a height position where laser light from the laser displacement meter 53 is incident on the side face of the substrate cover 10.

In FIG. 6B, as the substrate cover position measurement process (S104), the measurement processing unit 64 controls the laser displacement meter 53 so that the laser displacement meter 53 measures the position of the substrate cover 10 by irradiating the side face of the substrate cover 10 with the laser light 11 while the substrate cover 10 that covers the entire outer circumferential portion of a substrate to be written from above is not mounted on the substrate 101.

Figure 7:
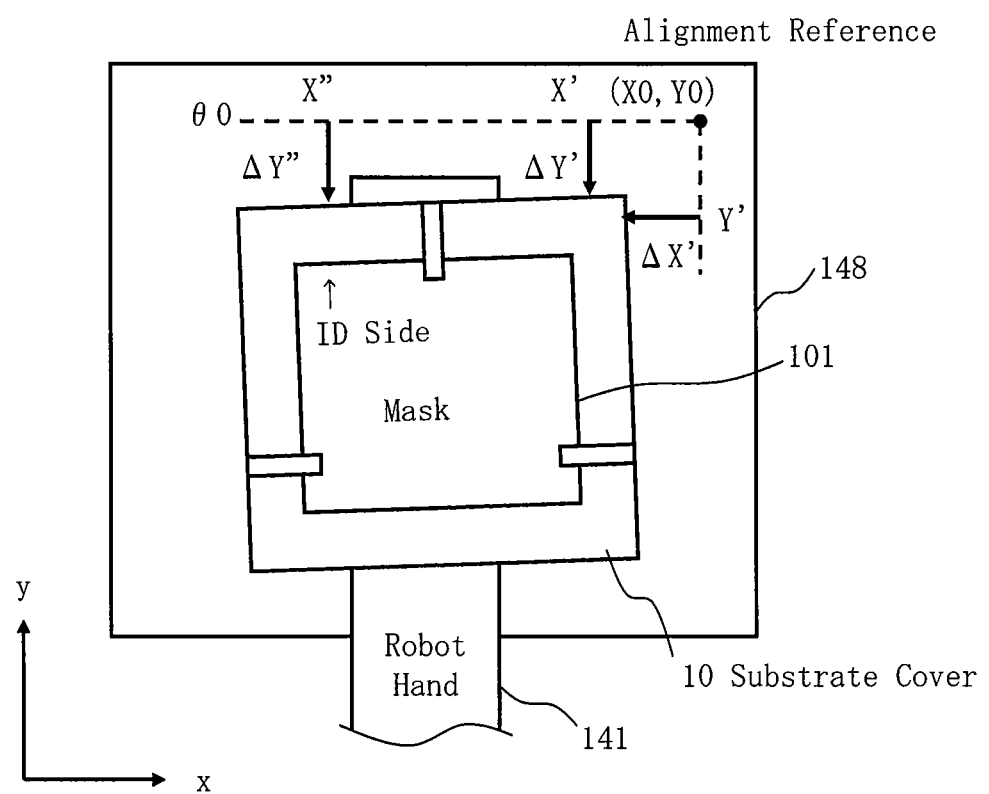
FIG. 7 is a conceptual diagram exemplifying a method of measuring the position of the substrate cover according to Embodiment 1.

FIG. 7 is a conceptual diagram exemplifying a method of measuring the position of the substrate cover according to Embodiment 1. In FIG. 7, as the position of the substrate cover 10, for example, distances $\Delta Y'$, $\Delta Y''$ in the y direction up to the end face of the substrate cover 10 in positions X', X" from a reference position (X0, Y0) and a distance $\Delta X'$ in the x direction up to the end face of the substrate cover 10 in a position Y' from the reference position (X0, Y0) are measured. Based on the position information of the three points, an x position (x1), a y position (y1), and a rotational position ($\theta 1$) of the substrate cover 10 in the measurement coordinate system can be measured. In the example of FIG. 7, the positions of X', X" are positions on both sides supported by a robot hand 141 of the transport robot 142, but the present embodiment is not limited to such an example. The positions of X', X" are both on the side of the reference position from the robot hand 141 of the transport robot 142. Alternatively, the positions of X', X" are both on the opposite side thereof. (x1, y1, $\theta 1$) are determined here as the position of the substrate cover 10, but the position is not limited to such an example and in Embodiment 1, it is enough to determine at least the x, y positions (x1, y1). The position information of the substrate cover 10 measured before being mounted on the substrate 101 is stored in the storage device 116.

Figure 8:
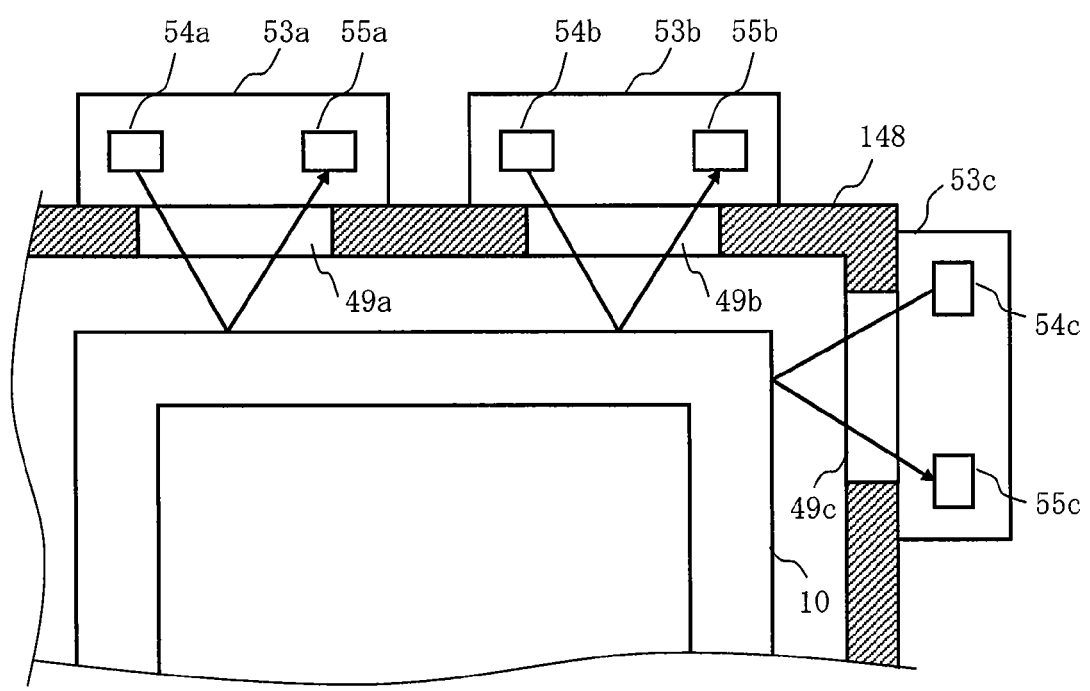
FIG. 8 is a conceptual diagram exemplifying a measuring mechanism according to Embodiment 1.

FIG. 8 is a conceptual diagram exemplifying a measuring mechanism according to Embodiment 1. In FIG. 8, a measuring mechanism 50 includes a plurality of the laser displacement meters 53. In this case, three laser displacement meters 53a, 53b, 53c are arranged. More specifically, the three laser displacement meters are arranged in each position of X', X" from the reference position (X0, Y0) in image data and in the position of Y' from the reference position (X0, Y0). Each of the laser displacement meters 53 is arranged on the outer side of the substrate cover mounting/removal chamber 148. The distance from each of the three positions to the end face of the substrate cover 10 is measured. Each of the three laser displacement meters 53a, 53b, 53c may measure the position of the substrate cover 10 by receiving through a photodetector 55 reflected light of laser light generated by a laser generator 54 and reflected by the end face of the substrate cover 10 via the glass window 49. The obtained position data is output to the measurement processing unit 64. By making position measurements by the laser displacement meters 53, variations of measurement depending on the shape of the substrate 101 such as the end face shape of the substrate, the C surface shape of mask corners, and variations in transmittance can be suppressed. Also, in contrast to image capturing by a conventional CCD camera or the like, illumination can be made unnecessary. Thus, the measuring time can also be reduced. While an error due to the shape dependence of the substrate 101 when, for example, a CCD camera is used is 72 μm, an error due to the shape dependence when the laser displacement meter 53 is used can be reduced to 8.3 μm. Also, while the measuring time when, for example, a CCD camera is used is 5.39 s, the measuring time when the laser displacement meter 53 is used can be reduced to 0.93 s. Incidentally, an ND filter is suitably installed on the photodetector 55. Accordingly, when making measurement of a mirror finished surface having a high gloss, the amount of light can be reduced to an optimum amount of laser light so that more accurate measurements can be made. For example, the side face of the substrate 101 may become a mirror finished surface after attachment of a chromium (Cr) film to the side face of the substrate 101. The amount of light may be too much if laser light generated by the laser generator 54 is directly shone on the mirror finished surface and reflected light thereof is directly received and an error in measurement results is produced, though smaller than an error when a CCD camera or the like is used. By installing an ND filter, the amount of light in the above case can be reduced so that position measurements can be made with a preset amount of light.

As the substrate cover misregistration operation process (S106), the measurement processing unit 64 operates (or "calculates") the position of the substrate cover 10 using position data output from the laser displacement meters 53. Then, the misregistration operation unit 66 operates misregistration amounts ($\Delta x1$, $\Delta y1$, $\Delta \theta 1$) of the substrate cover 10 between a relative reference position of the substrate cover 10 relative to the reference position of the substrate 101 and the position of the substrate cover 10 measured by the laser displacement meter 53 while the substrate cover 10 is not mounted on the substrate 101. Information of the misregistration amounts ($\Delta x1$, $\Delta y1$, $\Delta \theta 1$) of the substrate cover 10 measured before being mounted on the substrate 101 is stored in the storage device 116.

Figure 9A:
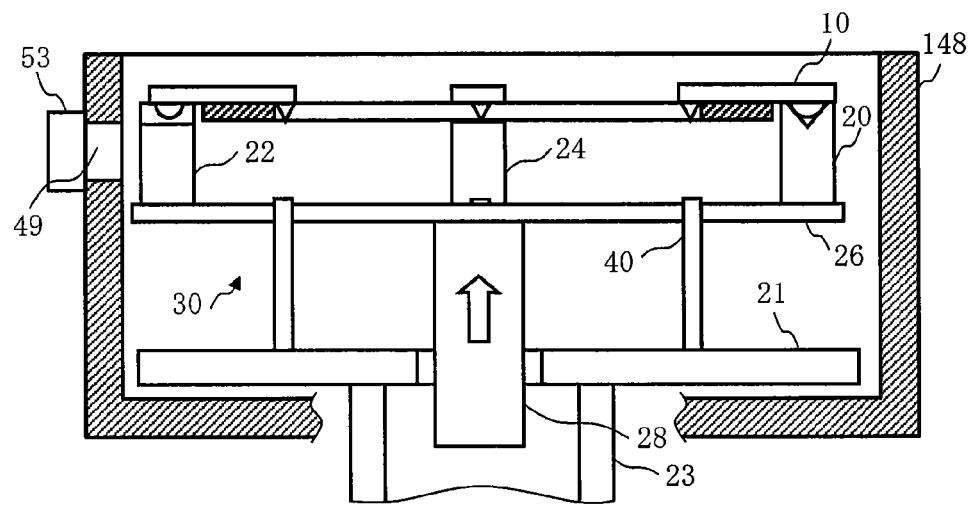
FIGS. 9A and 9B are conceptual diagrams showing the configuration and operation of the substrate cover mounting/removal mechanism according to Embodiment 1.
Figure 9B:
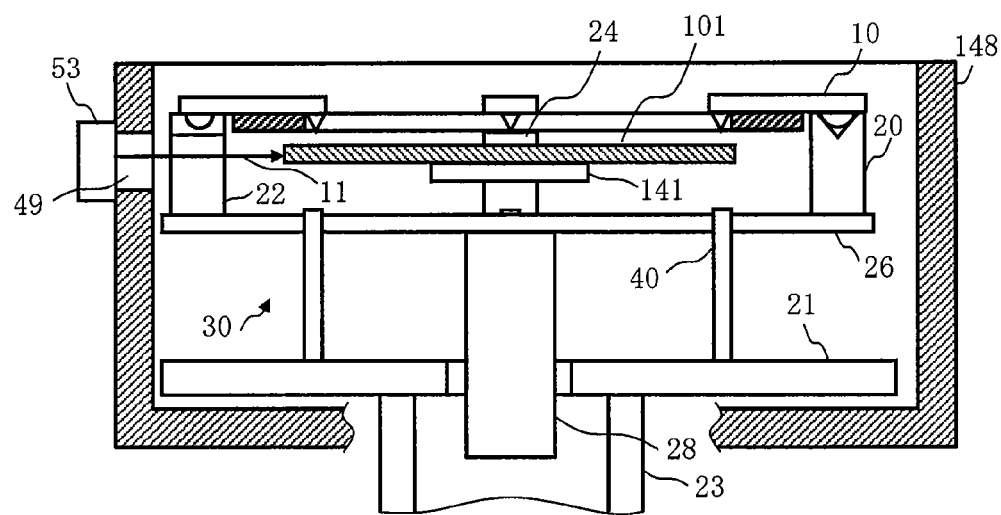

FIGS. 9A and 9B are conceptual diagrams showing the configuration and operation of the substrate cover mounting/removal mechanism according to Embodiment 1. FIGS. 9A and 9B show the operation of the substrate cover movement process (S108) to the substrate position measurement process (S112).

In FIG. 9A, as the substrate cover movement process (S108), the cover mounting/removal processing unit 70 moves the substrate cover 10 upward from the measuring position. By, for example, lifting the rise and fall shaft 28, as shown in FIG. 9A, the substrate cover 10 is moved up to a height position that prevents interference with the substrate cover 10 even if the substrate 101 is carried in.

In FIG. 9B, as the substrate transport process (S110), the transport processing unit 62 transports the substrate 101 into the substrate cover mounting/removal chamber 148. For the transport, first the following transport operation is performed. First, the transport processing unit 62 performs transport processing of the substrate 101 arranged in the carrying-in/out port 120.

Figure 10:
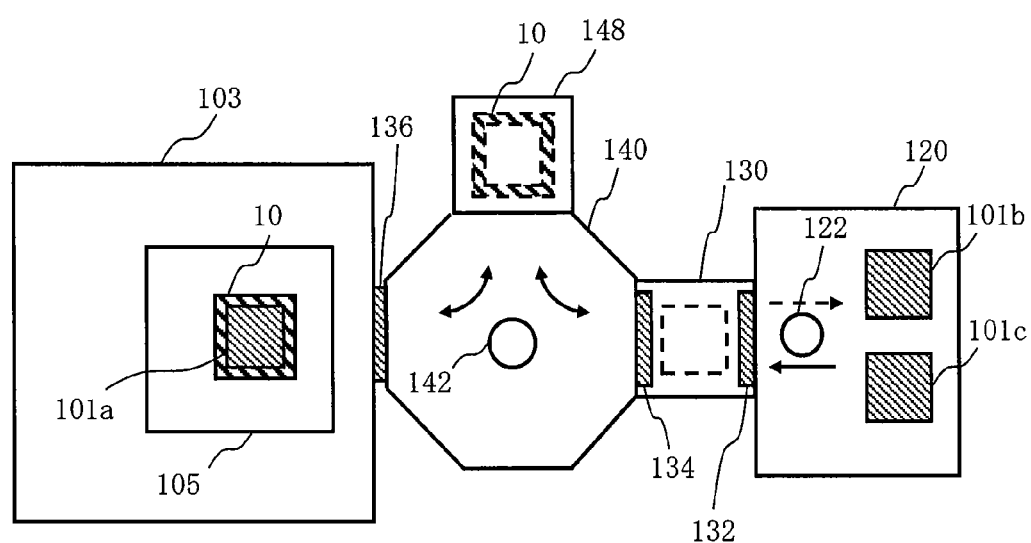
FIG. 10 is a top conceptual diagram showing a transport path inside the writing apparatus according to Embodiment 1.
Figure 11:
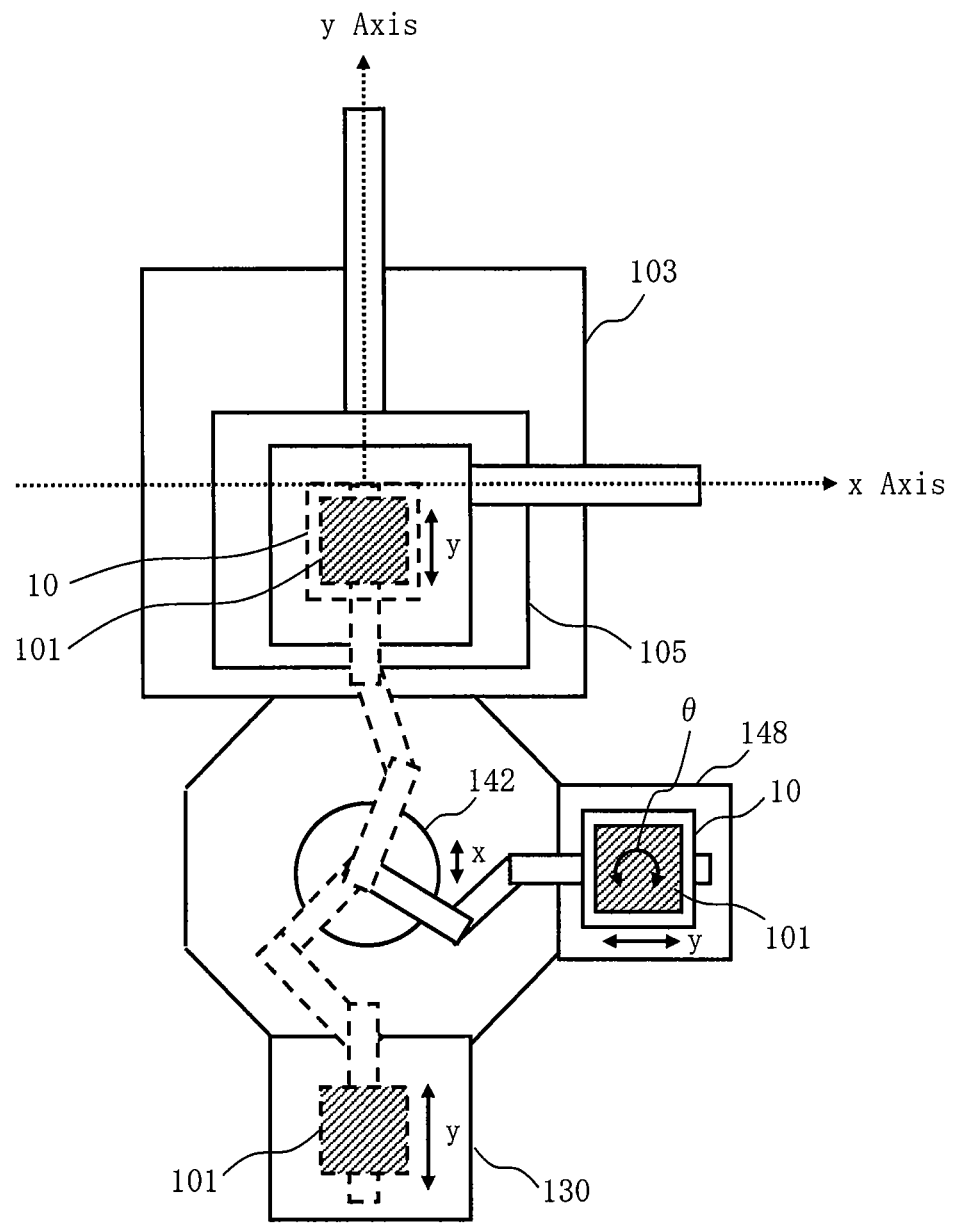
FIG. 11 is a conceptual diagram illustrating transport by a transport robot according to Embodiment 1.

FIG. 10 is a top conceptual diagram showing a transport path inside the writing apparatus according to Embodiment 1. FIG. 11 is a conceptual diagram illustrating transport by a transport robot according to Embodiment 1. After the gate valve 132 being opened, the substrate 101 arranged in the carrying-in/out port 120 is transported onto a support member in the L/L chamber 130 by the transport robot 122. Then, after the gate valve 132 being closed, the gate valve 134 is opened and the substrate 101 is transported onto the substrate cover mounting/removal mechanism 30 inside the substrate cover mounting/removal chamber 148 by the transport robot 142 via the robot chamber 140. Here, the substrate 101 is carried in by the transport robot 142 to a position where the substrate 101 only needs to be lowered onto the three substrate support pins 40 of the substrate cover mounting/removal mechanism 30 and then, as shown in FIG. 9B, adjusted to a height of the measurement position where measurement by the laser displacement meter 53 can be made while being placed on the robot hand 141 of the transport robot 142.

As the substrate position measurement process (S112), the measurement processing unit 64 controls the laser displacement meter 53 so that the laser displacement meter 53 measures the position of the substrate 101 by irradiating the side face of the substrate 101 with the laser light 11 while the substrate cover 10 is not mounted on the substrate 101. The position of the substrate 101 may be measured in the same manner as when the position of the substrate cover 10 is measured. For example, as described with reference to FIG. 7, distances $\Delta Y'$, $\Delta Y''$ in the y direction up to the end face (side face) of the substrate 101 in the positions $X'$, $X''$ from the reference position $(X0, Y0)$ and a distance $\Delta X'$ in the x direction up to the end face (side face) of the substrate 101 in the position $Y'$ from the reference position $(X0, Y0)$ are measured. Based on the position information of the three points, an x position (x2), a y position (y2), and a rotational position ($\theta 2$) of the substrate 101 in the measurement coordinate system can be measured. (x2, y2, $\theta 2$) are determined here as the position of the substrate 101, but the position is not limited to such an example and in Embodiment 1, it is enough to determine at least the x, y positions (x2, y2). The position information of the substrate 101 measured before the substrate cover 10 being mounted thereon is stored in the storage device 116.

Then, the measurement processing unit 64 operates the position of the substrate 101 using position data output from the laser displacement meters 53. Then, the misregistration operation unit 66 operates misregistration amounts ($\Delta x2$, $\Delta y2$, $\Delta \theta 2$) relative to the reference position of the substrate 101 while the substrate cover 10 is not mounted on the substrate 101. Information of the misregistration amounts ($\Delta x2$, $\Delta y2$, $\Delta \theta 2$) of the substrate 101 measured before the substrate cover 10 being mounted thereon is stored in the storage device 116.

As the substrate position correction process (S114), the correction processing unit 68 exercises control so that the relative position between the substrate 101 and the substrate cover 10 is corrected by shifting the position of the substrate 101 by misregistration amounts ($\Delta x1$, $\Delta y1$, $\Delta \theta 1$) of the substrate cover 10 between the above relative reference position of the substrate cover 10 and the position of the substrate cover 10 measured by the laser displacement meter 53. Here, it is suitable first to correct the reference position of the substrate 101 for misregistration amounts ($\Delta x2$, $\Delta y2$, $\Delta \theta 2$) of the substrate 101 and then move the position of the substrate 101 by shifting by misregistration amounts ($\Delta x1$, $\Delta y1$, $\Delta \theta 1$) of the substrate cover 10. More specifically, shift amounts may be set to differences between misregistration amounts ($\Delta x1$, $\Delta y1$, $\Delta \theta 1$) of the substrate cover 10 and misregistration amounts ($\Delta x2$, $\Delta y2$, $\Delta \theta 2$) of the substrate 101 to move the position of the substrate 101 by shifting by such shift amounts. Accordingly, the relative position between the substrate 101 and the substrate cover 10 can be made an ideal physical relationship.

In actual position corrections, shift amounts in the x and y directions are corrected by the transport robot 142 under the control of the correction processing unit 68. Corrections of misregistration amounts in the x and y directions are made by controlling the position of an arm of the transport robot 142. More specifically, control is exercised as described below. For example, as shown in FIG. 9B, the correction processing unit 68 controls the transport robot 142 in a state in which the substrate 101 is supported by the arm (robot hand) of the transport robot 142 so that the position of the substrate 101 mounted on the substrate cover mounting/removal mechanism 30 is shifted by shift amounts in the x and y directions. The transport robot 142 is an example of a correction unit. Next, the position of the substrate 101 is shifted for a misregistration amount in the rotation direction.

Figure 12A:
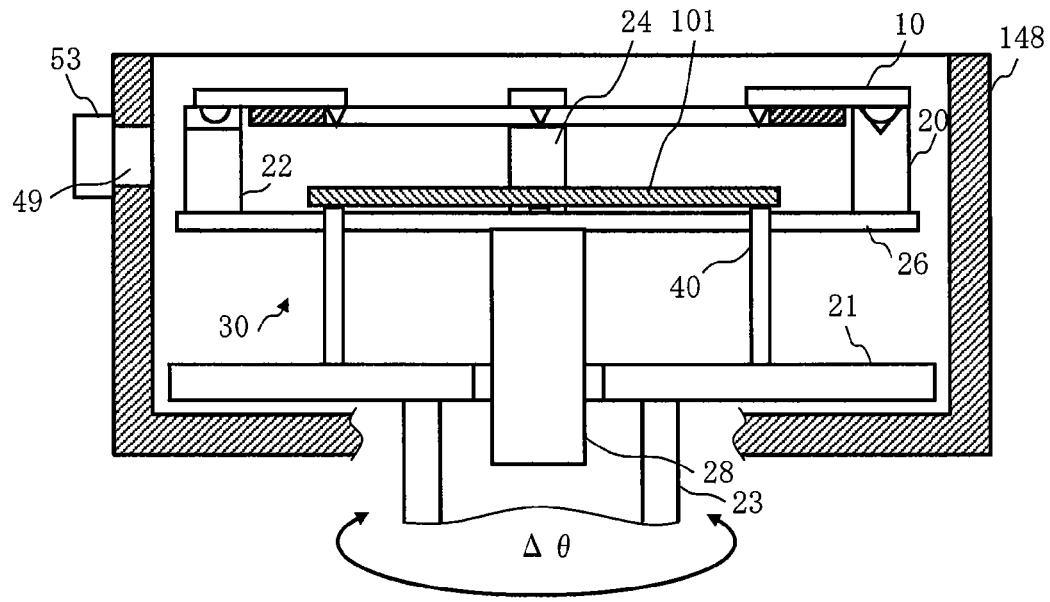
FIGS. 12A and 12B are conceptual diagrams showing the configuration and operation of the substrate cover mounting/removal mechanism according to Embodiment 1.
Figure 12B:
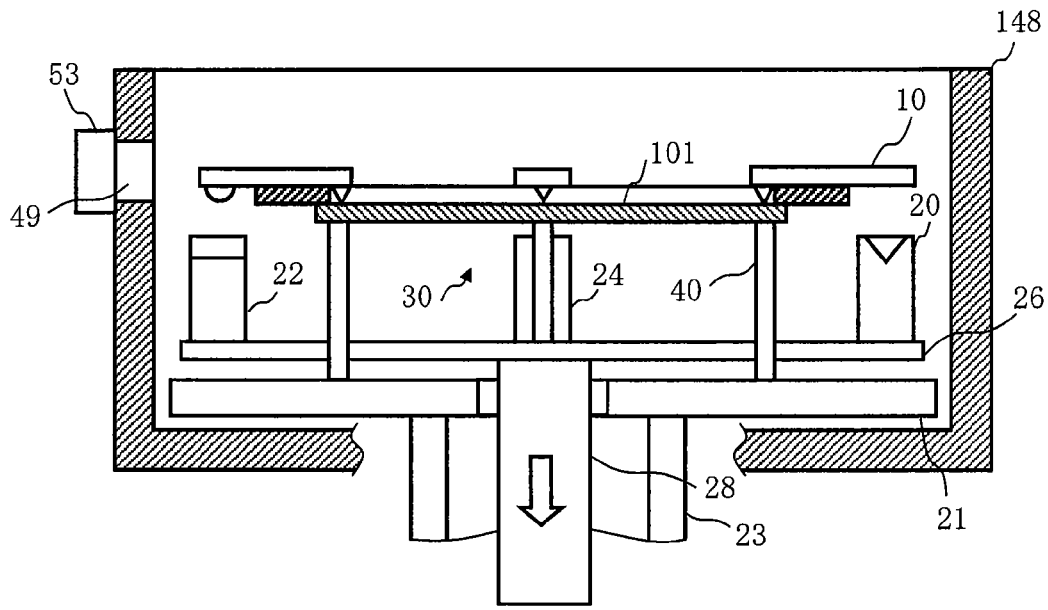

FIGS. 12A and 12B are conceptual diagrams showing the configuration and operation of the substrate cover mounting/removal mechanism according to Embodiment 1. FIGS. 12A and 12B show the operation of the substrate position correction process (S114) and the cover mounting process (S116).

In FIG. 12A, after the position of the substrate 101 being shifted by shift amounts in the x and y directions, the transport processing unit 62 mounts the substrate 101 in a shifted state on the three substrate support pins 40 of the substrate cover mounting/removal mechanism 30. Then, under the control of the correction processing unit 68, the position of the substrate 101 is shifted by the substrate 101 being rotated by the shift amount in the rotation direction by a rotating stage formed of the three substrate support pins 40 and the rotation base plate 21. In this manner, the misregistration amount (shift amount) in the rotation direction is corrected by rotating the rotating stage. The rotating stage is an example of the correction unit.

In FIG. 12B, as the cover mounting process (S116), the cover mounting/removal processing unit 70 mounts the substrate cover 10 on the substrate 101 for which the relative position between the substrate 101 and the substrate cover 10 has been corrected by shifting the position of the substrate 101. More specifically, by lowering, as shown in FIG. 12B, the rise and fall shaft 28 from the state shown in FIG. 12A, the substrate cover 10 is mounted on the substrate 101. Here, the rise and fall shaft 28 is lowered until the three alignment support members 20, 22, 24 are positioned below the height 14 so that the substrate on which the substrate cover 10 is mounted can be carried out.

Figure 13A:
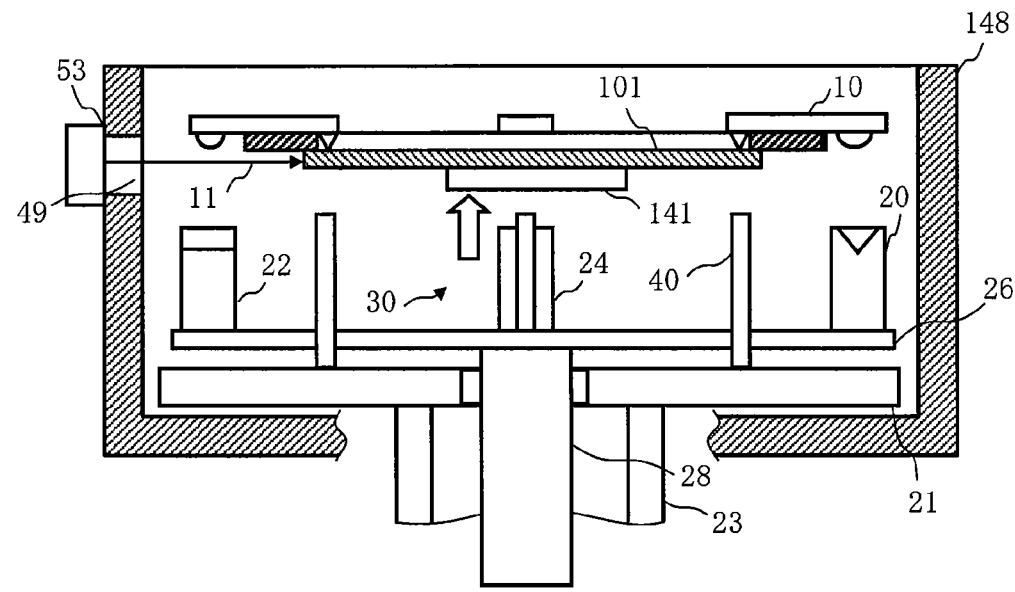
FIGS. 13A and 13B are conceptual diagrams showing the configuration and operation of the substrate cover mounting/removal mechanism according to Embodiment 1.
Figure 13B:
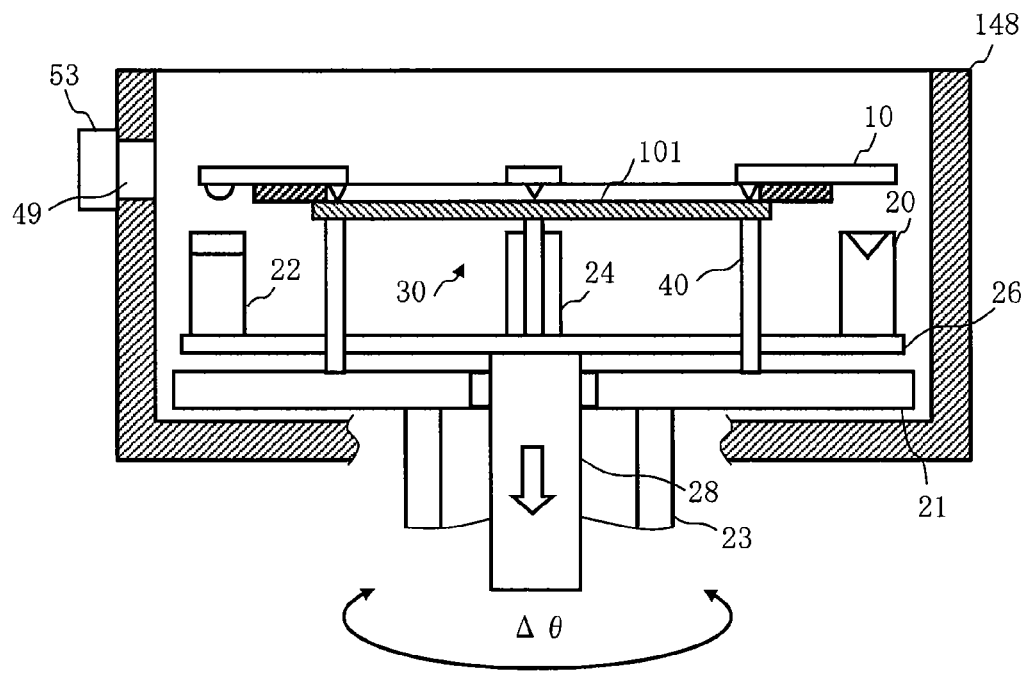

FIGS. 13A and 13B are conceptual diagrams showing the configuration and operation of the substrate cover mounting/removal mechanism according to Embodiment 1. FIGS. 13A and 13B show the operation of the cover mounted substrate measuring position movement process (S118) to the cover mounted substrate position correction process (S124).

In FIG. 13A, as the cover mounted substrate measuring position movement process (S118), the transport robot 142 puts the robot hand 141 thereof below the backside of the substrate 101 under the control of the transport processing unit 62 to lift the substrate 101 on which the substrate cover 10 is mounted. Then, the transport robot 142 adjusts the substrate 101 to a height of the measurement position where measurement by the laser displacement meter 53 can be made while the substrate 101 being placed on the robot hand 141 of the transport robot 142.

Then, as the substrate position measurement process (S120), under the control of the measurement processing unit 64, the position of the substrate 101 is measured by the laser displacement meters 53 while the substrate cover 10 is mounted on the substrate 101 before a pattern is written by the writing unit 150. The measuring method is the same as described above.

Then, as the substrate misregistration operation process (S122), the measurement processing unit 64 operates the position of the substrate 101 using position data output from the laser displacement meters 53. Then, the misregistration operation unit 66 operates misregistration amounts (Δx3, Δy3, Δθ3) relative to the reference position of the substrate 101 while the substrate cover 10 is mounted on the substrate 101. Information of the misregistration amounts (Δx3, Δy3, Δθ3) of the substrate 101 measured after the substrate cover 10 being mounted thereon is stored in the storage device 116.

As the cover mounted substrate position correction process (S124), the position of the substrate 101 measured by the laser displacement meters 53 is corrected for misregistration amounts from the reference position of the substrate 101. More specifically, corrections are made for misregistration amounts (Δx3, Δy3) in the x and y directions by the transport robot 142 under the control of the correction processing unit 68. The correction method is the same as described above. Then, after corrections being made, the substrate 101 is mounted on the three substrate support pins 40 of the substrate cover mounting/removal mechanism 30. The misregistration amount (Δθ3) in the rotation direction is corrected by, as shown in FIG. 13B, rotating the rotating stage under the control of the correction processing unit 68.

After the relative physical relationship between the substrate cover 10 and the substrate 101 being corrected as described above, misregistration of the substrate 101 mounted with the substrate cover 10. Accordingly, the relative physical relationship between the substrate cover 10 and the substrate 101 can be aligned with high accuracy and also the position of the substrate 101 can be aligned with high accuracy. Then, the substrate 101 corrected for such misregistration amounts and on which the substrate cover 10 is mounted is then transported by the transport robot 142 onto the XY stage 105 of the pattern writing chamber 103 by opening the gate valve 136. Then, after the gate valve 136 being closed, a predetermined pattern is written on the substrate 101 on the XY stage 105.

As the pattern writing process (S126), the writing unit 150 writes a pattern onto the substrate 101 corrected for misregistration amounts by using an electron beam 200 while the substrate cover 10 is mounted on the substrate 101. More specifically, the pattern writing data processing unit 60 first reads pattern writing data from the storage device 114 and performs a plurality of stages of data conversion processing to generate shot data specific to the device. The shot data is temporarily stored in the storage device 114. Then, the pattern writing controller 72 controls the control circuit 112 to drive the writing unit 150 along the shot data. Then, the operation inside the writing unit 150 is as described above.

The electron beam 200 emitted from the electron gun assembly 201 as an example of an irradiation unit illuminates the whole first aperture plate 203 having an oblong, for example, a rectangular hole due to the illumination lens 202. Here, the electron beam 200 is first shaped in an oblong shape. Then, the electron beam 200 in a first aperture plate image after passing through the first aperture plate 203 is projected onto the second aperture plate 206 by the projection lens 204. The position of the first aperture plate image on the second aperture plate 206 is deflection-controlled by the deflector 205 so that the beam shape and dimensions can be changed (variably shaped). As a result, the electron beam 200 is variably shaped for each shot. Then, the electron beam 200 in a second aperture plate image after passing through the second aperture plate 206 is focused by the objective lens 207 and deflected by the deflector 208. As a result, the desired position of the substrate 101 on the continuously moving XY stage 105 is irradiated with the electron beam 200. The electron beam 200 of a plurality of shots is irradiated by the above operation and shot figures formed by the shots are combined to write a desired pattern.

When the pattern writing is completed, the gate valve 136 is opened to move the substrate 101 on which the substrate cover 10 is mounted from the XY stage 105 in the pattern writing chamber 103 into the robot chamber 140 by the transport robot 142. Then, after the gate valve 136 being closed, the substrate 101 is carried into the substrate cover mounting/removal chamber 148.

Figure 14:
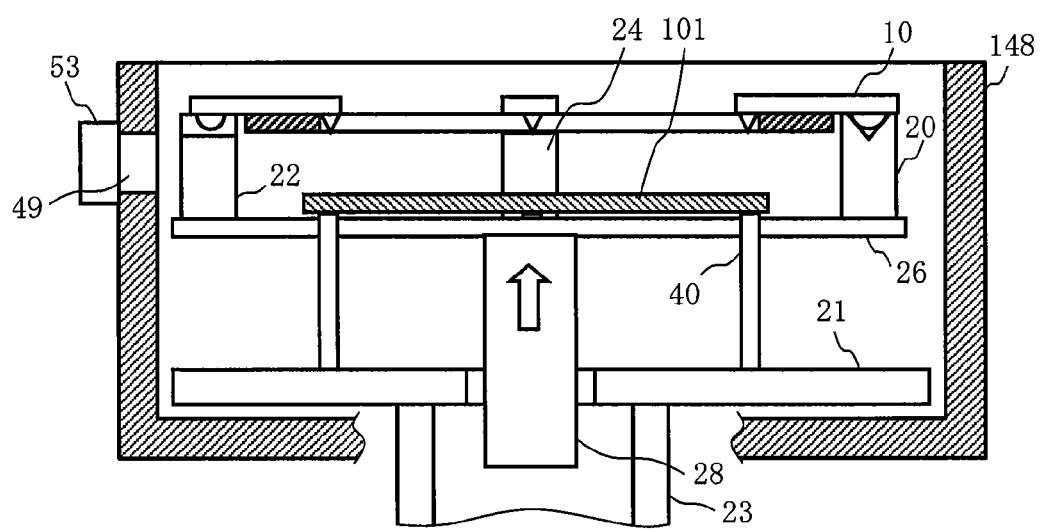
FIG. 14 is a conceptual diagram showing the configuration and operation of the substrate cover mounting/removal mechanism according to Embodiment 1.
Figure 16:
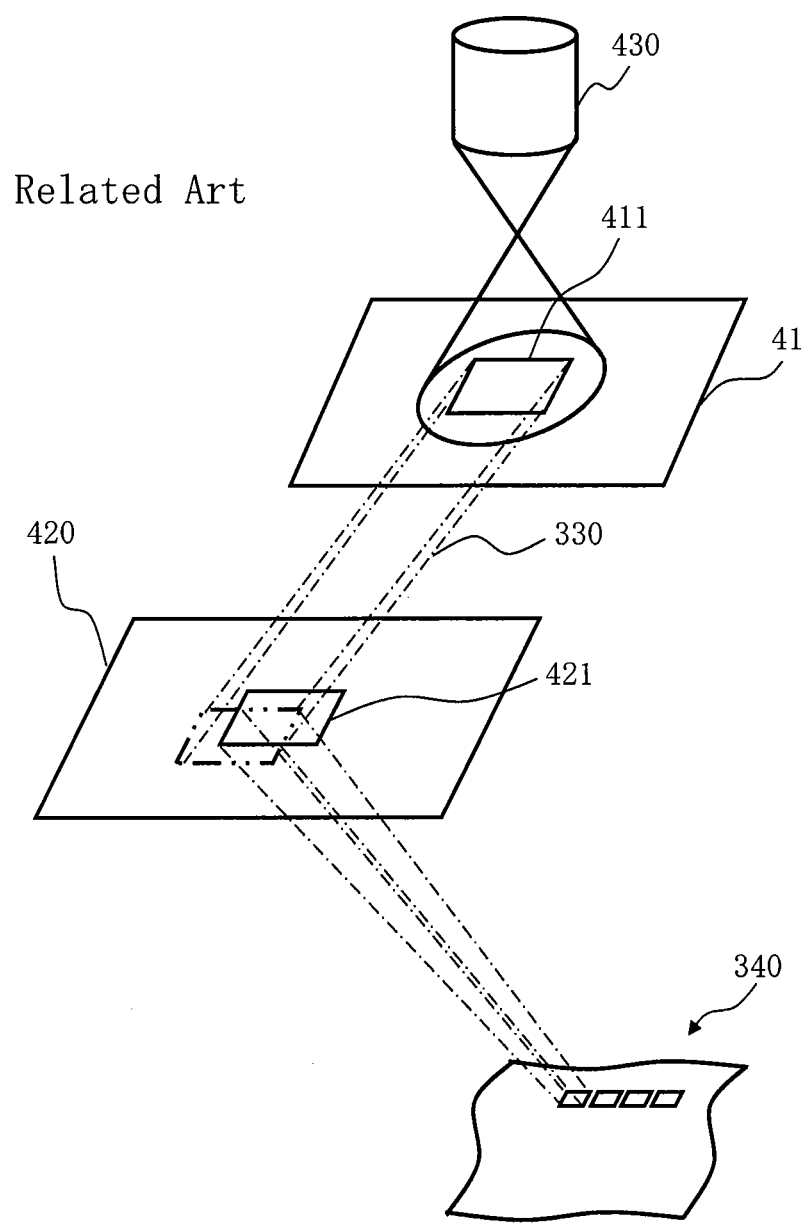
FIG. 16 is a conceptual diagram illustrating the operation of a variable-shaped electron beam writing apparatus.

FIG. 14 is a conceptual diagram showing the configuration and operation of the substrate cover mounting/removal mechanism according to Embodiment 1. FIG. 14 shows the operation of the cover removal process (S128).

In FIG. 14, as the cover removal process (S128), the cover mounting/removal processing unit 70 removes the substrate cover 10 from the substrate 101 on which the substrate cover 10 is mounted after the pattern writing is completed. More specifically, the operation thereof is as described below. The transport robot 142 mounts the substrate 101 on which the substrate cover 10 is mounted on the three substrate support pins 40 while the rise and fall shaft 28 is lowered. By lifting the rise and fall shaft 28 in such a state, as shown in FIG. 14, the substrate cover 10 is removed from the substrate 101. After the substrate cover 10 being removed, alignment is suitably performed as described below.

FIGS. 15A to 15F are conceptual diagrams showing top surface shapes of three alignment support members according to Embodiment 1. FIG. 15A shows a top view of the alignment support member 20 and FIG. 15B shows a front sectional view of the alignment support member 20. A conical groove portion formed in a conical groove is formed on the top surface of the alignment support member 20. FIG. 15C shows a top view of the alignment support member 22 and FIG. 15D shows a front sectional view of the alignment support member 22. A V-shaped groove portion formed in a V-shaped groove is formed on the top surface of the alignment support member 22. Then, FIG. 15E shows a top view of the alignment support member 24 and FIG. 15F shows a front sectional view of the alignment support member 24. A plane portion formed as a plane is formed on the top surface of the alignment support member 24. Each of the alignment support members 20, 22, 24 has the hemispheric height 14 of the substrate cover 10 mounted thereon. The alignment support members 20, 22, 24 perform alignment of the substrate cover 10 under the self-weight of the landed substrate cover 10. That is, the one height 14 moves along the inclination of the conical groove portion for positioning to some point. The other one height 14 moves along the inclination of the V-shaped groove portion in one of plane directions for positioning. Then, the remaining one height 14 becomes free in the plane directions on the plane portion. Thus, the position can be determined relative to the point positioned by the conical groove portion. As shown in FIGS. 15A to 15F, the height of the top surface of the alignment support member 24 is formed so as to match the height when the height 14 is mounted on the other two alignment support members 20, 22. The angle of inclination ° of the conical groove portion and V-shaped groove portion with the z axis is suitably set so that $\sin\theta \times \cos\theta > 2\mu$ is satisfied by using the maximum coefficient of static friction μ between the alignment support members 20, 22, 24 and the height 14.

With the configuration described above, no movement (side slip) in the plane direction of the substrate cover 10 occurs even if contact of the substrate cover 10 with the alignment support members 20, 22, 24 is started by lifting the rise and fall shaft 28. If movement (side slip) in the plane direction should occur, the amount thereof is small. Therefore, sliding between the substrate cover 10 and the substrate 101 can be suppressed or further reduced. As a result, scoring of the substrate 101 due to sliding can be suppressed or further reduced.

As the carrying-out process (S130), the transport processing unit 62 carries out the substrate 101 from which the substrate cover 10 has been removed. More specifically, the robot hand 141 of the transport robot 142 is put to the back side of the substrate 101 from which the substrate cover 10 has been removed before the robot hand 141 being lifted. Then, the substrate 101 is transported to the robot chamber 140 by the robot hand 141 on which the substrate 101 is supported being brought back. Then, the gate valve 134 is opened so that the substrate 101 is transported to the stage in the load lock chamber 130 by the transport robot 142. Then, after the gate valve 134 being closed, the gate valve 132 is opened so that the substrate 101 is carried out to the carrying-in/out port 120 by the transport robot 122.

In the transport operation described above, the vacuum pump 170 operates each time the degree of vacuum in each chamber drops to maintain the degree of vacuum. Alternatively, the valve 172 or the valve 174 may be opened/closed for the evacuation by the vacuum pump 170 in operation to maintain the desired degree of vacuum.

According to Embodiment 1, as described above, the position can be measured with high accuracy to eliminate misregistration. Also, misregistration between the substrate 101 and the substrate cover 10 can be suppressed with high accuracy. Further, misregistration of the substrate 101 on which the substrate cover 10 is mounted can be corrected with high accuracy.

In the foregoing, an embodiment has been described with reference to concrete examples. However, the present invention is not limited to such concrete examples. In the above example, the rotating stage mechanism corrects the misregistration amount ($\Delta\theta$) in the rotation direction and also shifts the substrate 101 by the shift amount in the rotation direction, but the present invention is not limited to such an example. The transport robot 142 may correct the misregistration amount ($\Delta\theta$) of position in the rotation direction, in addition to misregistration amounts of position in the x and y directions and shift the substrate 101 by the shift amount in the rotation direction.

Also in the above example, the alignment function of the substrate cover 10 is added to the substrate cover mounting/removal mechanism 30, but the present invention is not limited to such an example. In the above example, the relative physical relationship to the substrate 101 is corrected by making position measurements by the laser displacement meters 53 even if misregistration of the substrate cover 10 on the substrate cover mounting/removal mechanism 30 arises and thus, alignment by the substrate cover mounting/removal mechanism 30 may not be performed.

The description of portions that are not directly needed for the description of the present invention such as the apparatus configuration and control method is omitted, but the needed apparatus configuration or control method can appropriately be selected and used. For example, the description of the configuration of a controller that controls the writing apparatus 100 is omitted, but it is needless to say that the needed controller configuration is appropriately selected and used.

In addition, all cover mounting/removal mechanisms on/from a substrate, all cover mounting/removal methods on/from a substrate, all writing apparatuses, and all pattern writing methods that include elements of the invention and whose design can be changed as appropriate by persons skilled in the art are included in the scope of the present invention.

Additional advantages and modification will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A charged particle beam writing apparatus comprising:
a laser displacement meter configured to measure a position of a substrate cover by irradiating the substrate cover with laser light and receiving reflected light of the laser light reflected by an end face of the substrate cover, while the substrate cover that covers an entire outer circumferential portion of a substrate to be written from above is not mounted on the substrate;
a writing unit configured to write a pattern onto the substrate by using a charged particle beam while the substrate cover is mounted on the substrate;
a correction unit configured to correct a relative position between the substrate and the substrate cover while the substrate cover is not mounted on the substrate by shifting of the substrate a misregistration amount calculated from a reference position of the substrate cover relative to a reference position of the substrate, and the position of the substrate cover measured by the laser displacement meter while the substrate cover is not mounted on the substrate; and
a substrate cover mounting/removal mechanism unit configured to mount the substrate cover on the substrate after the relative position between the substrate and the substrate cover has been corrected by shifting substrate and to remove the substrate cover from the substrate.

2. The apparatus according to claim 1, wherein
the laser displacement meter measures the position of the substrate while the substrate cover is mounted on the substrate before a pattern is written by the writing unit, and
the correction unit is configured to correct the position of the substrate measured by the laser displacement meter while the substrate cover is mounted on the substrate by shifting the substrate by a misregistration amount calculated from the reference position of the substrate and the position of the substrate measured by the laser displacement meter while the substrate cover is mounted on the substrate.

3. The apparatus according to claim 2, wherein
the substrate cover mounting/removal mechanism unit includes:
a plurality of rod-like support members configured to support the substrate cover; and
a plurality of support pins configured to support the substrate without interfering with a platform table.

4. The apparatus according to claim 3, wherein the laser displacement meter measures the position of the substrate cover while the substrate cover is supported on the plurality of rod-like support members and the substrate is not supported on the plurality of support pins.

5. A charged particle beam writing method comprising:
measuring a position of a substrate cover by irradiating the substrate cover with laser light and receiving reflected light of the laser light reflected by an end face of the substrate cover, while the substrate cover that covers an entire outer circumferential portion of a substrate to be written from above is not mounted on the substrate;
correcting a relative position between the substrate and the substrate cover while the substrate cover is not mounted on the substrate by shifting the substrate by a misregistration amount calculated from a reference position of the substrate cover relative to a reference position of the substrate, and the position of the substrate cover measured while the substrate cover is not mounted on the substrate;
mounting the substrate cover on the substrate after the relative position between the substrate and the substrate cover has been corrected by shifting the substrate; and
writing a pattern onto the substrate by using a charged particle beam while the substrate cover is mounted on the substrate.

6. The method according to claim 5, wherein the position of the substrate cover is measured by using a laser displacement meter.

7. The method according to claim 6, further comprising: measuring the position of the substrate while the substrate cover is not mounted on the substrate.

8. The method according to claim 7, further comprising: measuring the position of the substrate after the substrate cover is mounted on the substrate.

* * * * *